US009520553B2

(12) United States Patent
Siddik et al.

(10) Patent No.: US 9,520,553 B2
(45) Date of Patent: Dec. 13, 2016

(54) METHODS OF FORMING A MAGNETIC ELECTRODE OF A MAGNETIC TUNNEL JUNCTION AND METHODS OF FORMING A MAGNETIC TUNNEL JUNCTION

(71) Applicant: Micron Technology, Inc., Boise, ID (US)

(72) Inventors: Manzar Siddik, Singapore (SG); Witold Kula, Gilroy, CA (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/687,317

(22) Filed: Apr. 15, 2015

(65) Prior Publication Data

US 2016/0308123 A1      Oct. 20, 2016

(51) Int. Cl.
*H01L 43/08*      (2006.01)
*G11B 5/127*      (2006.01)
(Continued)

(52) U.S. Cl.
CPC .............. *H01L 43/12* (2013.01); *H01L 43/08* (2013.01); *H01L 43/10* (2013.01)

(58) Field of Classification Search
CPC .......... H01L 43/08; H01L 43/02; H01L 43/12; H01L 27/222; H01L 43/00; G11B 5/3909; G11B 5/39; G11B 5/127; G11C 11/16; G11C 11/5657
See application file for complete search history.

(56) References Cited

U.S. PATENT DOCUMENTS 5,640,343 A    6/1997  Gallagher et al.
5,898,548 A    4/1999  Dill
(Continued)

FOREIGN PATENT DOCUMENTS

CN      1339159       3/2002
EP      11845727.4    11/2014
(Continued)

OTHER PUBLICATIONS

U.S. Appl. No. 14/563,303, filed Dec. 8, 2014, Chen et al.
(Continued)

*Primary Examiner* — Jarrett Stark
*Assistant Examiner* — Bitew Dinke
(74) *Attorney, Agent, or Firm* — Wells St. John, P.S.

(57) ABSTRACT

A method of forming a magnetic electrode of a magnetic tunnel junction comprises forming non-magnetic MgO-comprising material over conductive material of the magnetic electrode being formed. An amorphous metal is formed over the MgO-comprising material. Amorphous magnetic electrode material comprising Co and Fe is formed over the amorphous metal. The amorphous magnetic electrode material is devoid of B. Non-magnetic tunnel insulator material comprising MgO is formed directly against the amorphous magnetic electrode material. The tunnel insulator material is devoid of B. After forming the tunnel insulator material, the amorphous Co and Fe-comprising magnetic electrode material is annealed at a temperature of at least about 250° C. to form crystalline Co and Fe-comprising magnetic electrode material from an MgO-comprising surface of the tunnel insulator material. The crystalline Co and Fe-comprising magnetic electrode material is devoid of B. Other method and non-method embodiments are disclosed.

34 Claims, 4 Drawing Sheets

(51) Int. Cl.
  *G11B 5/39*  (2006.01)
  *H01L 43/12*  (2006.01)
  *H01L 43/10*  (2006.01)

(56) References Cited

U.S. PATENT DOCUMENTS

| | | | |
|---|---|---|---|
| 5,949,600 A | 9/1999 | Akiyama | |
| 5,994,899 A | 11/1999 | Mohri | |
| 6,034,882 A | 3/2000 | Johnson et al. | |
| 6,048,632 A | 4/2000 | Solin | |
| 6,538,921 B2 | 3/2003 | Daughton | |
| 6,600,184 B1 | 7/2003 | Gill | |
| 6,603,677 B2 | 8/2003 | Redon et al. | |
| 6,788,502 B1 | 9/2004 | Gill | |
| 7,009,278 B2 | 3/2006 | Hsu | |
| 7,233,024 B2 | 6/2007 | Scheuerlein et al. | |
| 7,324,313 B2* | 1/2008 | Childress | B82Y 10/00 360/324.12 |
| 7,595,520 B2 | 9/2009 | Horng et al. | |
| 7,629,637 B2 | 12/2009 | Kajiyama et al. | |
| 7,660,153 B2 | 2/2010 | Yamane et al. | |
| 7,755,076 B2 | 7/2010 | Lung | |
| 7,944,738 B2 | 5/2011 | Liu et al. | |
| 7,981,697 B2 | 7/2011 | Wang | |
| 7,983,065 B2 | 7/2011 | Samachisa | |
| 8,098,520 B2 | 1/2012 | Seigler et al. | |
| 8,102,700 B2 | 1/2012 | Liu et al. | |
| 8,124,968 B2 | 2/2012 | Koo et al. | |
| 8,218,357 B2 | 7/2012 | Liu et al. | |
| 8,310,861 B2 | 11/2012 | Liu et al. | |
| 8,338,224 B2 | 12/2012 | Yoon et al. | |
| 8,431,458 B2 | 4/2013 | Sills et al. | |
| 8,536,556 B2 | 9/2013 | Fukumizu | |
| 8,553,450 B2 | 10/2013 | Hosotani et al. | |
| 8,559,141 B1* | 10/2013 | Pakala | G01R 33/098 360/324.2 |
| 8,609,439 B2 | 12/2013 | Prejbeanu et al. | |
| 8,836,056 B2 | 9/2014 | Oguz et al. | |
| 8,842,465 B2 | 9/2014 | Yamane et al. | |
| 9,099,124 B1* | 8/2015 | Freitag | G11B 5/3909 |
| 9,177,573 B1* | 11/2015 | Oh | G11B 5/33 |
| 9,257,136 B1* | 2/2016 | Siddik | G11B 5/127 |
| 2002/0018355 A1 | 2/2002 | Johnson et al. | |
| 2002/0079524 A1 | 6/2002 | Dennison | |
| 2004/0057295 A1 | 3/2004 | Matsukawa et al. | |
| 2005/0006682 A1* | 1/2005 | Bae | B82Y 10/00 257/295 |
| 2005/0174835 A1 | 8/2005 | Rinerson et al. | |
| 2005/0247964 A1 | 11/2005 | Pietambaram et al. | |
| 2005/0254289 A1 | 11/2005 | Nakajima et al. | |
| 2006/0017081 A1 | 1/2006 | Sun et al. | |
| 2007/0064350 A1* | 3/2007 | Gill | B82Y 25/00 360/324.2 |
| 2007/0064352 A1* | 3/2007 | Gill | B82Y 25/00 360/324.11 |
| 2007/0096229 A1 | 5/2007 | Yoshikawa | |
| 2007/0243638 A1 | 10/2007 | Horng et al. | |
| 2008/0144234 A1 | 6/2008 | Lin | |
| 2008/0164548 A1* | 7/2008 | Ranjan | G11C 11/16 257/421 |
| 2008/0182015 A1 | 7/2008 | Parkin | |
| 2009/0046397 A1 | 2/2009 | Sun et al. | |
| 2009/0261314 A1 | 10/2009 | Kim et al. | |
| 2009/0261343 A1 | 10/2009 | Herner et al. | |
| 2009/0323385 A1 | 12/2009 | Scheuerlein et al. | |
| 2010/0006960 A1 | 1/2010 | Horng et al. | |
| 2010/0080894 A1* | 4/2010 | Tsunekawa | B82Y 25/00 427/131 |
| 2010/0135061 A1 | 6/2010 | Li et al. | |
| 2010/0157657 A1 | 6/2010 | Rinerson et al. | |
| 2010/0259962 A1 | 10/2010 | Yan et al. | |
| 2011/0062538 A1 | 3/2011 | Rizzo et al. | |
| 2011/0149646 A1 | 6/2011 | Liu et al. | |
| 2011/0309322 A1 | 12/2011 | Hwang | |
| 2011/0318848 A1* | 12/2011 | Choi | B82Y 25/00 438/3 |
| 2012/0056285 A1 | 3/2012 | Bessho et al. | |
| 2012/0068139 A1* | 3/2012 | Daibou | H01L 43/10 257/2 |
| 2012/0087179 A1 | 4/2012 | Jung | |
| 2012/0127603 A1 | 5/2012 | Gao | |
| 2012/0193216 A1* | 8/2012 | Endo | C23C 14/50 204/192.1 |
| 2012/0241879 A1 | 9/2012 | Ikeno et al. | |
| 2012/0286382 A1 | 11/2012 | Jan et al. | |
| 2013/0037862 A1 | 2/2013 | Kitagawa et al. | |
| 2013/0071954 A1* | 3/2013 | Zhou | H01L 43/12 438/3 |
| 2013/0148418 A1 | 6/2013 | Luo et al. | |
| 2013/0177781 A1 | 7/2013 | Chepulskyy et al. | |
| 2013/0181305 A1 | 7/2013 | Nakayama et al. | |
| 2013/0224521 A1 | 8/2013 | Wang et al. | |
| 2013/0236639 A1* | 9/2013 | Carey | G11B 5/3163 427/130 |
| 2013/0241015 A1 | 9/2013 | Nomachi | |
| 2013/0307097 A1 | 11/2013 | Yi et al. | |
| 2014/0027869 A1 | 1/2014 | Lee et al. | |
| 2014/0038314 A1 | 2/2014 | Zhou | |
| 2014/0084401 A1* | 3/2014 | Kato | H01L 43/08 257/425 |
| 2014/0117477 A1 | 5/2014 | Park et al. | |
| 2014/0131649 A1 | 5/2014 | Daibou et al. | |
| 2014/0145792 A1 | 5/2014 | Wang et al. | |
| 2014/0175581 A1 | 6/2014 | Guo | |
| 2014/0203383 A1 | 7/2014 | Guo | |
| 2014/0248719 A1 | 9/2014 | Zhou et al. | |
| 2014/0269033 A1 | 9/2014 | Natori et al. | |
| 2014/0284742 A1 | 9/2014 | Sawada et al. | |
| 2014/0287537 A1 | 9/2014 | Shukh | |
| 2015/0069562 A1 | 3/2015 | Sandhu | |
| 2015/0076633 A1 | 3/2015 | Siddik et al. | |
| 2015/0102439 A1 | 4/2015 | Gan et al. | |
| 2015/0137289 A1* | 5/2015 | Khalili Amiri | G11C 11/16 257/421 |
| 2015/0280113 A1* | 10/2015 | Tan | H01L 43/12 438/3 |
| 2016/0105176 A1 | 4/2016 | Miura | |

FOREIGN PATENT DOCUMENTS

| | | |
|---|---|---|
| JP | 2008-034857 | 2/2008 |
| JP | 2009-267411 | 11/2009 |
| JP | 2010-010688 | 1/2010 |
| JP | 2010-034153 | 2/2010 |
| JP | 2010-232214 | 10/2010 |
| JP | 2010-263211 | 11/2010 |
| JP | 2012-519957 | 8/2012 |
| JP | 2012-204432 | 10/2012 |
| JP | 2012-523647 | 10/2012 |
| JP | 2013-140891 | 7/2013 |
| KR | 10-2008-0084590 | 9/2008 |
| KR | 2010-0083402 | 7/2010 |
| KR | 10-2015-0031311 | 3/2015 |
| WO | WO 2010/101340 | 9/2010 |
| WO | WO PCT/US2011/059095 | 5/2012 |
| WO | WO PCT/US2011/059095 | 6/2013 |
| WO | WO PCT/US2014/047572 | 10/2014 |
| WO | WO PCT/US2015/061568 | 2/2016 |
| WO | WO PCT/US2014/047572 | 3/2016 |
| WO | WO PCT/2016/018045 | 5/2016 |
| WO | WO PCT/2016/018077 | 6/2016 |

(56) References Cited

FOREIGN PATENT DOCUMENTS

| WO | WO PCT/US2016/018015 | 6/2016 |
|---|---|---|
| WO | WO PCT/US2016/014259 | 7/2016 |
| WO | WO PCT/US2016/24219 | 7/2016 |

OTHER PUBLICATIONS

U.S. Appl. No. 14/706,182, filed May 7, 2015, Harms et al.
U.S. Appl. No. 14/687,280, filed Apr. 15, 2015, Siddik et al.
U.S. Appl. No. 14/684,110, filed Apr. 10, 2015, Sandhu.
U.S. Appl. No. 14/704,023, filed May 5, 2015, Siddik.
Annealing influence on the Gilbert damping parameter and the exchange constant of CoFeB thin films; Conca et al.; Applied Physics Letter 104; May 8, 2014; pp. 182407-1-182401-4.
Annealing of CoFeB/MgO based single and double barrier magnetic tunnel junctions: Tunnel magnetoresistance, bias dependence, and output voltage; Feng et al; Journal of Applied Physics, vol. 105, Feb. 11, 2009; pp. 033916-1 to 033916-7.
Atomic and Electronic Structure of CoFeB/MgO Interface from First Principles; Burton et al.; Applied Physics Letters, vol. 89; Oct. 5, 2006; pp. 142507-1 to 142507-3.
Boron diffusion in magnetic tunnel junctions with MgO (001) barriers and CoFeB electrodes; Kurt et al.; Applied Physics Letters, vol. 96; Jun. 28, 2010; pp. 262501-1 to 262501-3.
Boron diffusion induced symmetry reduction and scattering in CoFeB/MgO/CoFeB magnetic tunnel junctions; Bai et al.; The American Physical Society; Physical Review B, vol. 87; Jan. 23, 2013; pp. 014114-1 to 014114-6.
Boron migration due to annealing in CoFeB/MgO/CoFeB interfaces: A combined hard x-ray photoelectron spectroscopy and x-ray absorption studies; Rumaiz et al.; Applied Physics Letters, vol. 99; Nov. 28, 2011; pp. 222502-1 to 222502-3.
Boron segregation in crystallized MgO/amorphous-Co 40 Fe 40 B 20 Co 40 Fe 40 B 20 Co 40 Fe 40 B 20 thin films; You et al.; Journal of Applied Physics, vol. 104, Aug. 5, 2008; pp. 033517-1 to 033517-6.
Comparative material issues for fast reliable switching in STT-RAMs; Munira et al.; 2011 11th IEEE International Conference on Nanotechnology; Aug. 15-18, 2012; pp. 1403-1408.
Comparison of Synthetic Antiferromagnets and Hard Ferromagnets as Reference Layer in Magnetic Tunnel Junctions With Perpendicular Magnetic Anisotropy; Bandiera et al.; Spin Electronics; IEE Magnetics Letters, vol. 1; Jul. 8, 2010; 4 pp.
Damping of CoxFe80-xB20 ultrathin films with perendicular magnetic anisotropy; Devolder et al.; Applied Physics Letters 102; Jan. 15, 2013; pp. 022407-1-022407-4.
Exchange coupling of bilayers and synthetic antiferromagnets pinned to MnPt; Rickart et al.; The European Physical Journal B; Mar. 8, 2005; pp. 1-6.
Giant tunnelling magnetoresistance at room temperature with MgO (100) tunnel barriers; Parkin et al.; nature materials, vol. 3; Oct. 31, 2004; pp. 862-867.
Magnetic Tunnel Junctions; Zhu et al.; Materialstoday; vol. 9, No. 11; Nov. 2006; pp. 36-45.
Magnetoresistive Random-Access Memory; www.wikipedia.org/wiki/RAM; As downloaded from the Internet Jul. 28, 2013; 10 pp.
MgO barrier-perpendicular magnetic tunnel junctions with CoFe/Pd multilayers and ferromagnetic insertion layers; Mizunuma et al.; Laboratory for Nanoelectronics and Spintronics, Research Institute of Electrical Communication, Tohoku University; Advanced Research Laboratory, Hitachi, Ltd.; Dec. 11, 2009.
Microstructure and magnetic properties of FeCoN thin films; Kuo et al.; Journal of Applied Physics, vol. 83, No. 11; Jun. 1, 1998; pp. 6643-6645.
On the role of Ta cap in the recrystallization process of CoFeB layers; Bouchikhaoui et al.; Applied Physics Letters, vol. 103; Oct. 3, 2013; pp. 142412-1 to 142412-5.

Spin Pumping and Spin Transfer; Brataas et al.; arXiv:1108. 0385v3[cond-ma.tmes-hall]; Mar. 6, 2012; pp. 1-30.
Spin-dependent tunneling conductance of FezMgOzFe sandwiches; Butler et al.; The American Physical Society; Physical Review B, vol. 63; Jan. 8, 2001; pp. 054416-1 to 054416-12.
Spin-Transfer Torque; www.wikipedia.org/wiki/Spin-transfer_torque; As downloaded from the Internet Aug. 2, 2013; 2 pp.
Sputtered FeCoN Soft Magnetic Thin Films With High Resistivity; Jiang et al.; IEEE Transactions on Magnetics, vol. 39, No. 6; Nov. 2003; pp. 3559-3562.
Status and Challenges for Non-Volatile Spin-Transfer Torque RAM (STT-RAM); Krounbi et al.; International Symposium on Advanced Gate Stack-Technology; Sep. 23, 2010; 28 pp.
Theory of tunneling magnetoresistance of an epitaxial FeÕMgOÕFe/001 junction; Manthan et al.; The American Physical Society; Physical Review B, vol. 63; May 10, 2001; pp. 220403-1 to 220403-4.
Tunnel Magnetoresistance; www.wikipedia.org/wiki/tunnel_manetoresistance; As downloaded from the Internet Jul. 28, 2013; 5 pp.
Variation in the properties of the interface in a CoFeB/MgO/CoFeB tunnel junction during thermal annealing; Jang et al.; Applied Physics Letters, vol. 91; Sep. 4, 2007; pp. 102104-1 to 102104-3.
Zhang et al.; Large magnetoresistance in bcc Co/MgO/Co and FeCo/MgO/FeCo tunnel junctions; The American Physical Society; Physical Review B, vol. 70; Nov. 17, 2004; pp. 172407-1 to 172407-4.
U.S. Appl. No. 14/228,104, filed Mar. 27, 2014, Micron Technology, Inc.
U.S. Appl. No. 14/690,803, filed Apr. 20, 2015, Hineman.
Bai et al.; Boron diffusion induced symmetry reduction and scattering in CoFeB/MgO/CoFeB magnetic tunnel junctions; Physical Review B 87; Jan. 23, 2013; pp. 014114-1-014114-6.
Banderia et al.; Comparison of Synthetic Antiferromagnets and Hard Ferromagnets as Reference Layer in Magnetic Tunnel Junctions With Perpendicular Magnetic Anisotropy; IEEE Magnetics Letters, vol. 1; Jul. 8, 2010; 4 pp.
Bouchikhaoui et al.; On the role of Ta cap in the recrystallization process of CoFeB layers; Applied Physics Letters 103; Oct. 3, 2013; pp. 14212-1-14212-5.
Brataas et al.; Spin Pumping and Spin Transfer; Condensed Matter > Mesoscale and Nanoscale Physics; Cornell University; Mar. 6, 2012; pp. 1-30.
Burton et al.; Atomic and Electronic Structure of the Co Fe B MgO Interface From First Principles; Applied Physics Letters 89; Oct. 5, 2006; pp. 142507-1-142507-3.
Butler et al.; Spin-dependent tunneling conductance of Fe/MgO/Fe sandwiches; Physical Review B, vol. 63; Jan. 8, 2000; pp. 054416-1-054416-12.
Conca et al.; Annealing influence on the Gilbert damping parameter and the exchange constant of CoFeB thin films; Applied Physics Letters 104; May 8, 2014; pp. 182407-1-182407-4.
Devolder et al.; Damping of CoxFe80-xB20 ultrathin films with perpendicular magnetic anisotropy; Applied Physics Letters 102; Jan. 15, 2013; pp. 022407-1-022407-4.
Feng et al.; Annealing of CoFeB/MgO Based Single and Double Barrier Magnetic Tunnel Junctions: Tunnel Magnetoresistance, Bias Dependence, and Output Voltage; Journal of Applied Physics 105; Feb. 11, 2009; pp. 033916-1-033916-7.
Hopp et al.; Chemical Composition and Iron Oxidation State of the Amorphous Silicate Matrix in Acfer 094; 46th Lunar and Planetary Science Conferenrce; Jan. 27, 2015; 2 pp.
Jang et al.; Variation in the properties of the interface in a CoFeB/MgO/CoFeB tunnel junction during thermal anealing; Applied Physics Letters 91; Sep. 4, 2007; pp. 102104-1-102104-3.
Jiang et al.; Sputtered FeCoN soft magnetic thin films with high resistivity; IEEE Transactions on Magnetics, vol. 39, No. 6; Nov. 2003; pp. 3559-3562.
Kuo et al.; Microstructure and magnetic properties of FeCoN thin films; Journal of Applied Physics vol.83, No. 11; Jun. 1, 1998; pp. 6643-6645.

(56) References Cited

OTHER PUBLICATIONS

Kurt et al.; Boron diffusion in magnetic tunnel junctions with MgO (001) barriers and CoFeB electrodes; Applied Physics Letters 96; Jun. 28, 2010; pp. 262501-1-262501-3.

Liu et al.; Ferromagnetic resonance and damping properties of CoFeB thin films as free layers in MgO-based magnetic tunnel junctions; Journal of Applied Physics 110; Aug. 8, 2011; pp. 033910-1-033910-5.

Mathon et al.; Theory of tunneling magnetoresistance of an epitaxial FeO/MgO/Fe(?001)? junction; Physical Review B, vol. 63; May 10, 2001; pp. 220403-1-220403-4.

Mizunuma et al.; MgO barrier-perpendicular magnetic tunnel junctions with CoFe/Pd multilayers and ferromagnetic insertion layers; Applied Physics Letters; Dec. 11, 2009; 17 pp.

Munira et al.; Comparative material issues for fast reliable switching in STT-RAMs; 2011 11th IEEE International Conference on Nanotechnology; Aug. 15-18, 2011; pp. 1403-1408.

Parkin et al.; Giant tunnelling magnetoresistance at room temperature with MgO (100) tunnel barriers; Nature Materials, vol. 3; Dec. 31, 2004; pp. 862-867.

Rickart et al.; Exchange coupling of bilayers and synthetic antiferromagnets pinned to MnPt; The European Physics Journal B; Jan. 8, 2005; pp. 1-6.

Rumaiz et al.; Boron migration due to annealing in CoFeB/MgO/CoFeB interfaces: A combined hard x-ray photoelectron spectroscopy and x-ray absorption studies; Applied Physics Letters 99; Nov. 28, 2011; pp. 222502-1-222502-3.

Sun et al.; Effect of Subvolume Excitation and Spin-Torque Efficiency on Magnetic Switching; Physical Review B-84; Aug. 19, 2011; pp. 064413-1-064413-9.

Tsunoda et al.; A Novel MTJ for STT-MRAM With a Dummy Free Layer and Dual Tunnel Junctions; Electron Device Meeting; Dec. 10-13, 2012; pp. 29.1.1-29.1.4.

You et al.; Boron segregation in crystallized MgO/amorphous-$Co_{40}Fe_{40}B_{20}$ thin films; Journal of Applied Physics 104; Aug. 5, 2008; pp. 033517-1-0133517-6.

Zhang et al.; Large magnetoresistance in bcc Co/MgO/Co and FeCo/MgO/FeCo tunnel junctions; Physical Review B 70; Nov. 17, 2004; pp. 172407-1-172407-4.

U.S. Appl. No. 14/746,421, Jun. 22, 2015, Chen et al.

U.S. Appl. No. 15/154,033, May 13, 2016, Chen et al.

Marakov, A.; Chapter 4: Magnetoresistive Memory; Dissertation—Modeling of Emerging Resistive Switching Based Memory Cells; Apr. 4, 1985; 11 pp.

Sbiaa et al.; Materials with perpendicular magnetic anisotropy for magnetic random access memory; Phys. Status Solidi RRL 5, No. 12; 2011; pp. 413-419.

\* cited by examiner

METHODS OF FORMING A MAGNETIC ELECTRODE OF A MAGNETIC TUNNEL JUNCTION AND METHODS OF FORMING A MAGNETIC TUNNEL JUNCTION

TECHNICAL FIELD

Embodiments disclosed herein pertain to magnetic tunnel junctions, to methods of forming a magnetic electrode of a magnetic tunnel junction, and to methods of forming a magnetic tunnel junction.

BACKGROUND

A magnetic tunnel junction is an integrated circuit component having two conductive magnetic electrodes separated by a thin non-magnetic tunnel insulator material (e.g., dielectric material). The insulator material is sufficiently thin such that electrons can tunnel from one magnetic electrode to the other through the insulator material under appropriate conditions. At least one of the magnetic electrodes can have its overall magnetization direction switched between two states at a normal operating write or erase current/voltage, and is commonly referred to as the "free" or "recording" electrode. The other magnetic electrode is commonly referred to as the "reference", "fixed", or "pinned" electrode, and whose overall magnetization direction will not switch upon application of the normal operating write or erase current/voltage. The reference electrode and the recording electrode are electrically coupled to respective conductive nodes. The resistance of current flow between those two nodes through the reference electrode, insulator material, and the recording electrode is dependent upon the overall magnetization direction of the recording electrode relative to that of the reference electrode. Accordingly, a magnetic tunnel junction can be programmed into one of at least two states, and those states can be sensed by measuring current flow through the magnetic tunnel junction. Since magnetic tunnel junctions can be "programmed" between two current-conducting states, they have been proposed for use in memory integrated circuitry. Additionally, magnetic tunnel junctions may be used in logic or other circuitry apart from or in addition to memory.

The overall magnetization direction of the recording electrode can be switched by a current-induced external magnetic field or by using a spin-polarized current to result in a spin-transfer torque (STT) effect. Charge carriers (such as electrons) have a property known as "spin" which is a small quantity of angular momentum intrinsic to the carrier. An electric current is generally unpolarized (having about 50% "spin-up" and about 50% "spin-down" electrons). A spin-polarized current is one with significantly more electrons of either spin. By passing a current through certain magnetic material (sometimes also referred to as polarizer material), one can produce a spin-polarized current. If a spin-polarized current is directed into a magnetic material, spin angular momentum can be transferred to that material, thereby affecting its magnetization orientation. This can be used to excite oscillations or even flip (i.e., switch) the orientation/domain direction of the magnetic material if the spin-polarized current is of sufficient magnitude.

An alloy or other mixture of Co and Fe is one common material proposed for use as a polarizer material and/or as at least part of the magnetic recording material of a recording electrode in a magnetic tunnel junction. A more specific example is $Co_xFe_yB_z$ where x and y are each 10-80 and z is 0-50, and may be abbreviated as CoFe or CoFeB. MgO is an ideal material for the non-magnetic tunnel insulator. Ideally such materials are each crystalline having a body-centered-cubic (bcc) 001 lattice. Such materials may be deposited using any suitable technique, for example by physical vapor deposition. One technique usable to ultimately produce the bcc 001 lattice in such materials includes initially forming CoFe to be amorphous and upon which MgO-comprising tunnel insulator material is deposited. During and/or after the depositing, the MgO tunnel insulator, the CoFe, and the tunnel insulator ideally individually achieve a uniform bcc 001 lattice structure.

Boron is commonly deposited as part of the CoFe to assure or provide initial amorphous deposition of the CoFe. Crystallization of the CoFe can occur during or after deposition of the MgO by annealing the substrate at a temperature of at least about 350° C. This will induce the diffusion of B atoms out of the CoFe matrix being formed to allow crystallization into bcc 001 CoFe. Bcc 001 MgO acts as a template during the crystallization of CoFe. However, B in the finished magnetic tunnel junction construction, specifically at the CoFe/MgO interface or inside the MgO lattice, undesirably reduces tunneling magnetoresistance (TMR) of the magnetic tunnel junction.

DETAILED DESCRIPTION OF EXAMPLE EMBODIMENTS

Figure 1:
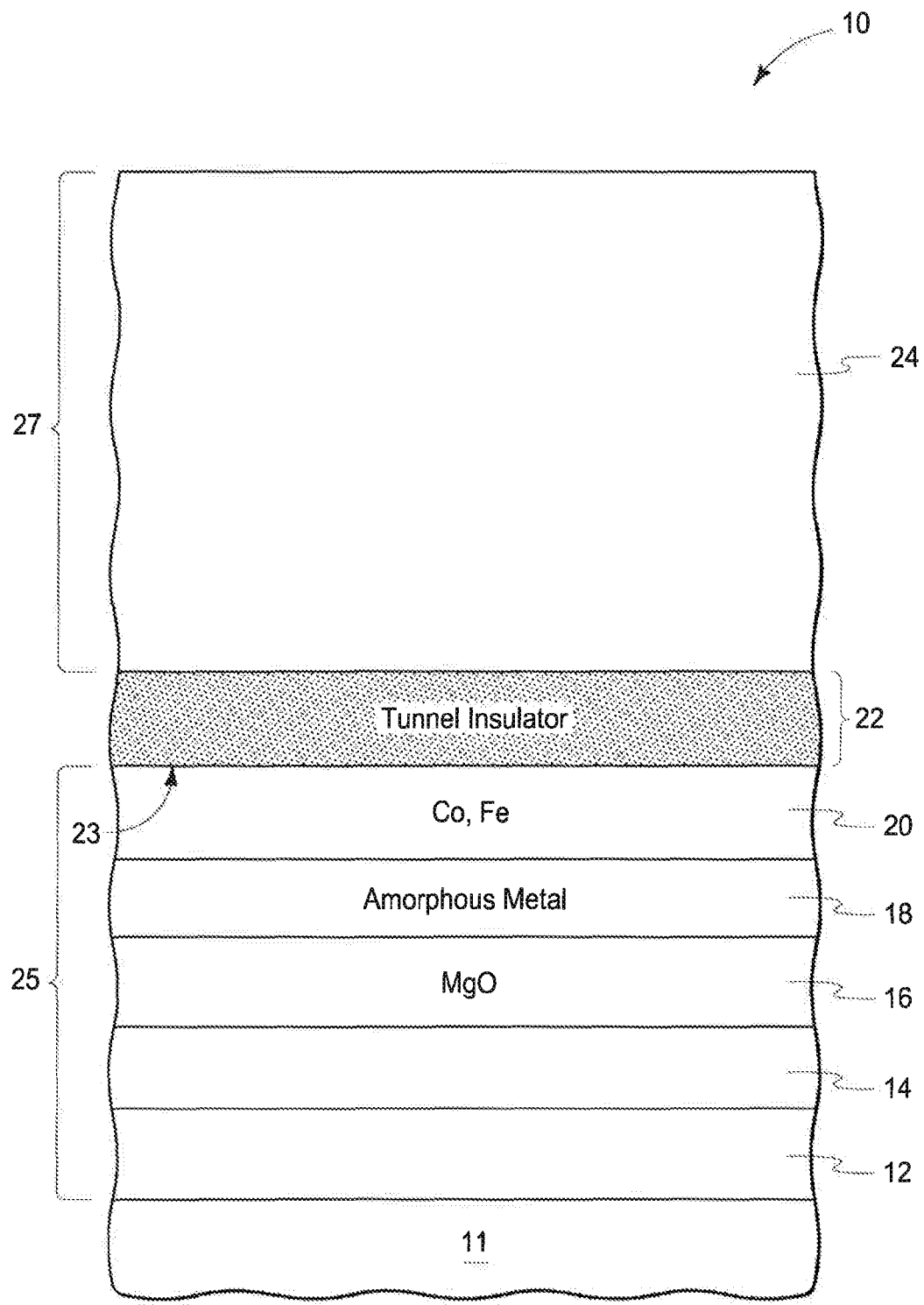
FIG. 1 is a diagrammatic sectional view of a substrate fragment.

Embodiments of the invention encompass methods of forming a magnetic electrode of a magnetic tunnel junction and methods of forming a magnetic tunnel junction. Additionally, embodiments of the invention encompass magnetic tunnel junctions independent of method of manufacture. Example methods in accordance with some embodiments of the invention are initially described with reference to FIG. 1 with respect to a substrate fragment 10, and which may comprise a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate fragment 10 comprises a base or substrate 11 showing various materials having been formed as an elevational stack there-over. Materials may be aside, elevationally inward, or elevationally outward of the FIG. 1-depicted materials. For example, other partially or wholly fabricated components of integrated circuitry may be provided somewhere about or within fragment 10. Substrate 11 may comprise any one or more of conductive (i.e., electrically herein), semiconductive, or insulative/insulator (i.e., electrically herein) material(s). Regardless, any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Conductive material 12 of a magnetic (i.e., ferrimagnetic or ferromagnetic herein) electrode material that is being formed is formed over substrate 11. Any conductive material may be used, such as one or more elemental metal(s), an alloy of two or more elemental metals, conductively doped semiconductive material, and conductive metal compounds. In one embodiment, conductive material 12 is non-magnetic. One specific example material 12 is elemental tantalum. An example maximum thickness for conductive material 12 is about 5 Angstroms to about 500 Angstroms. In this document, "thickness" by itself (no preceding directional adjective) is defined as the mean straight-line distance through a given material or region perpendicularly from a closest surface of an immediately adjacent material of different composition or of an immediately adjacent region. Additionally, the various materials or regions described herein may be of substantially constant thickness or of variable thicknesses. If of variable thickness, thickness refers to average thickness unless otherwise indicated. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials ore regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", and "against" not preceded by "directly" encompass "directly against" as well as construction where intervening material(s), region(s), or structure(s) result(s) in no physical touching contact of the stated materials, regions, or structures relative one another.

Material 14 comprising Co, Fe, and B is formed over conductive material 12. In one embodiment, material 14 comprises an alloy of Co and Fe, with amorphous $Co_{40}Fe_{40}B_{20}$ being an example. Characterization of a material or region as being "amorphous" where used in this document requires at least 90% by volume of the stated material to be amorphous. An example maximum thickness for material 14 when used is about 2 Angstroms to about 6 Angstroms.

Non-magnetic MgO-comprising material 16 is formed over conductive material 12 (regardless of presence of material 14). Material 16 may comprise, consist essentially of, or consist of MgO. An example maximum thickness for MgO-comprising material 16 is about 3 Angstroms to about 10 Angstroms. A purpose for including material 14 is to facilitate forming bcc 001 MgO during its deposition. A purpose for including material 16 is to facilitate perpendicular magnetic anisotropy in magnetic material of the conductive magnetic electrode being formed, which is a desirable operational trait of some magnetic tunnel junctions.

Amorphous metal 18 is formed over MgO-comprising material 16, and in one embodiment, as shown, is formed directly against MgO-comprising material 16. In one embodiment, amorphous metal 18 comprises an alloy of transition metals, and in one embodiment consists essentially of or consists of an alloy of transition metals. In one embodiment, amorphous metal 18 comprises an alloy comprising Fe, Co, and another transition metal. In one embodiment, amorphous metal 18 comprises an alloy of at least one of Hf, Zr, W, Mo, Al, Cr, and Ta and at least one of Fe, Co, and Ni. In one embodiment, amorphous metal 18 comprises a W alloy, for example any one or more of Fe, Co, and Ni alloyed with W. In one embodiment, amorphous metal 18 has a maximum thickness of about 3 Angstroms to about 5 Angstroms.

Amorphous magnetic electrode material 20 comprising Co and Fe is formed over, and in one embodiment directly against, amorphous metal 18. Amorphous magnetic electrode material 20 is devoid of B. In this document, "devoid of B" means 0 atomic % B to no more than 0.1 atomic % B. Reference to "magnetic" herein does not require a stated magnetic material or region to be magnetic as initially formed, but does require some portion of the stated magnetic material or region to be functionally "magnetic" in a finished circuit construction of the magnetic tunnel junction. In one embodiment, the Co and Fe of amorphous magnetic electrode material 20 are formed directly against amorphous metal 18. In one embodiment, amorphous magnetic electrode material 20 is formed at a temperature of 0° C. to about 30° C., and in one such embodiment at a temperature of at least about 20° C. In one embodiment, amorphous magnetic electrode material 20 is formed at a temperature of about −250° C. to less than 0° C., and in one such embodiment at a temperature of about −250° C. to about −20° C. Formation of electrode material 20 below 30° C., and ideally below 0° C., facilitates amorphous formation of such material when it is devoid of B and amorphous metal 18 is present. An example maximum thickness for material 20 is about 7 Angstroms to about 15 Angstroms.

Non-magnetic tunnel insulator material 22 comprising MgO is formed directly against amorphous magnetic electrode material 20. Tunnel insulator material 22 is devoid of B. Non-magnetic tunnel insulator material 22 may comprise, consist essentially of, or consist of MgO. An example maximum thickness for tunnel insulator material 22 is about 5 Angstroms to about 25 Angstroms.

Materials 12, 14, 16, 18, and 20 will collectively be used to ultimately form a conductive magnetic electrode 25 of the magnetic tunnel junction being formed. Material 24 is shown as being formed outwardly of tunnel insulator material 22, and in one embodiment directly against material 22, and will ultimately be used in forming another conductive magnetic electrode 27 of the magnetic tunnel junction being formed. One of electrodes 25 and 27 will be configured to comprise magnetic recording material while the other of electrodes 25 and 27 will be configured to comprise magnetic reference material. Electrodes 25 and 27 individually may contain non-magnetic insulator, semiconductive, and/or conductive material or regions. However, electrodes 25 and 27 when considered individually are characterized as being overall and collectively magnetic and conductive even though the electrode may have one or more regions therein that are intrinsically locally non-magnetic and/or non-conductive. An example maximum thickness for electrode 27 is about 20 Angstroms to about 150 Angstroms. As but one example, material 24 comprises 13 Angstroms of $Co_{40}Fe_{40}B_{20}$ directly against tunnel insulator material 22, 3

Angstroms of Ta directly against the $Co_{40}Fe_{40}B_{20}$, and 40 Angstroms of an alloy/multilayer of Co with Pd/Pt directly against the Ta, with electrode 27 in such example functioning as the magnetic reference electrode. Such materials collectively in such example constitute magnetic reference material thereof. Electrode 25 in such example functions as the magnetic recording electrode with, for example, material 20 upon crystallization ultimately functioning as the magnetic recording material.

After forming tunnel insulator material 22, amorphous Co and Fe-comprising magnetic electrode material 20 is annealed at a temperature of at least about 250° C. (e.g., in an inert atmosphere) to form crystalline Co and Fe-comprising magnetic electrode material 20 from an MgO-comprising surface of tunnel insulator material 22 (e.g., from a surface 23). Crystalline Co and Fe-comprising magnetic electrode material 20 is devoid of B. An example preferred upper temperature limit for the annealing is 450° C. Characterization of a material or region as being "crystalline" where used in this document requires at least 90% by volume of the stated material or region to be crystalline. In one embodiment, crystalline Co and Fe-comprising magnetic electrode material 20 has a maximum thickness of about 7 Angstroms to about 15 Angstroms.

Materials 12, 14, 16, 18, 20, 22, and 24 may be blanketly formed over a substrate 11 followed by collective patterning thereof to form a desired finished circuit construction of the magnetic tunnel junction being formed. Alternately, patterning of one or more such materials may occur before, during, or after any such materials are formed over substrate 11, and/or before, during, or after any annealing. Regardless, in one embodiment, conductive magnetic electrode 25 comprises magnetic recording material (e.g., crystalline Co and Fe-comprising material 20) and conductive magnetic electrode 27 comprises magnetic reference material. Additionally or alternately considered, the elevational positions of electrodes 25 and 27 may be reversed and/or an orientation other than an elevational stack may be used (e.g., lateral; diagonal; a combination of one or more of elevational, horizontal, diagonal; etc.). In this document, "elevational", "upper", "lower", "top", and "bottom" are with reference to the vertical direction. "Horizontal" refers to a general direction along a primary surface relative to which the substrate is processed during fabrication, and vertical is a direction generally orthogonal thereto. Further, "vertical" and "horizontal" as used herein are generally perpendicular directions relative one another and independent of orientation of the substrate in three-dimensional space.

Figure 2:
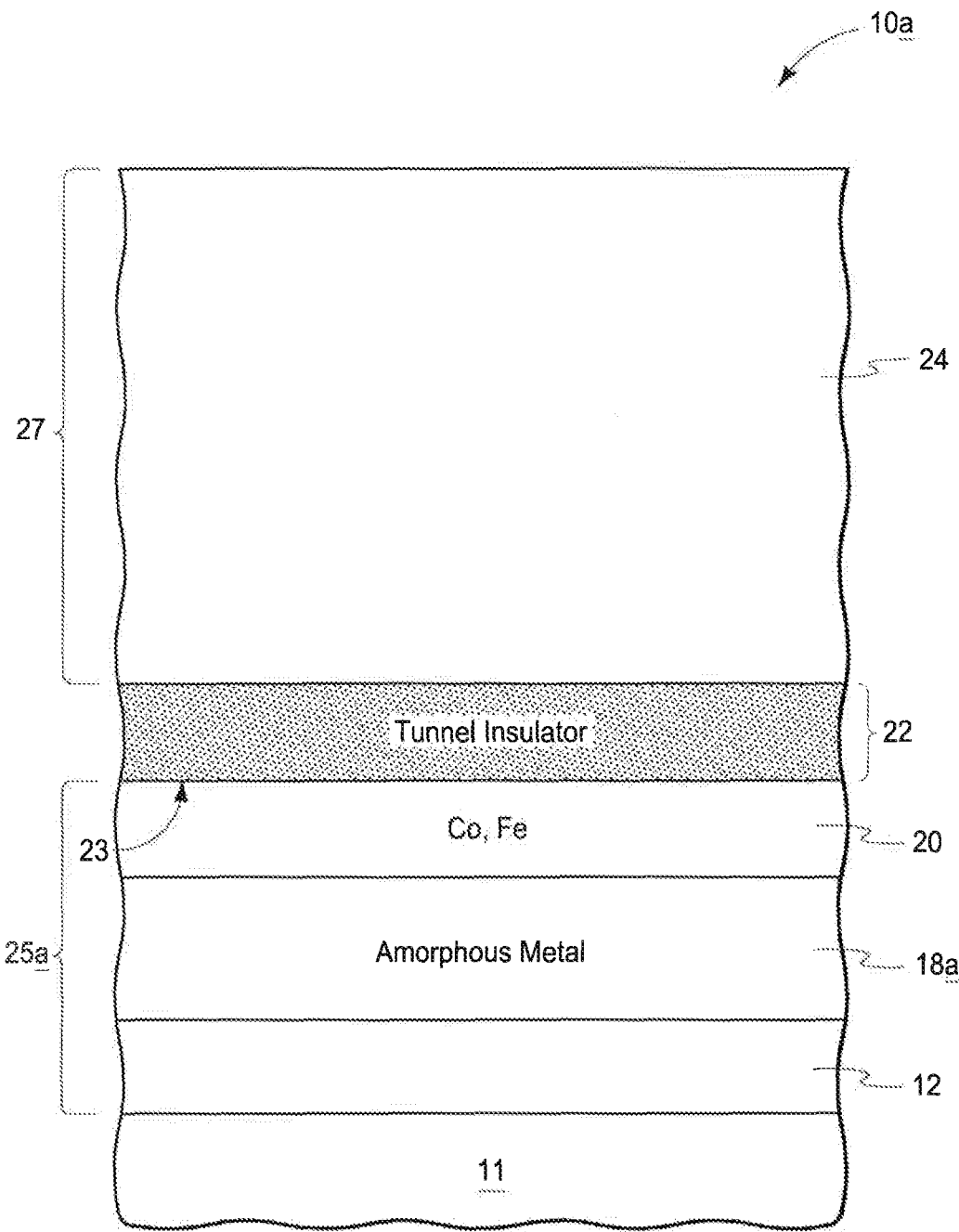
FIG. 2 is a diagrammatic sectional view of a substrate fragment.

Another embodiment method of forming a magnetic electrode of a magnetic tunnel junction is next described with reference to FIG. 2 with respect to a substrate fragment 10a. Like numerals from the above-described embodiments have been used where appropriate, with some construction differences being indicated with the suffix "a". Amorphous metal 18a is formed over substrate 11 (regardless of presence of conductive material 12 or other material). In one embodiment and as shown, amorphous metal 18a is formed directly against other physically and/or chemically different conductive material 12 of the magnetic electrode 25a being formed. In one embodiment, amorphous metal 18a has a maximum thickness of about 10 Angstroms to about 100 Angstroms.

Amorphous magnetic electrode material 20 comprising Co and Fe (and that is devoid of B) is formed over amorphous metal 18a at a temperature of about −250° C. to about 30° C. In one embodiment, amorphous magnetic electrode material 20a is formed at a temperature of 0° C. to about 30° C. In one embodiment, amorphous magnetic electrode material 20 is formed at a temperature of about −250° C. to less than about 0° C., and in one embodiment to less than about −20° C.

Non-magnetic tunnel insulator material 22 comprising MgO (and that is devoid of B) is formed directly against amorphous magnetic electrode material 20. After forming tunnel insulator material 22, amorphous Co and Fe-comprising magnetic electrode material 20 is annealed at a temperature of at least about 250° C. to form crystalline Co and Fe-comprising magnetic electrode material 20 (and that is devoid of B) from an MgO-comprising surface of tunnel insulator material 22 (e.g., from surface 23). Any other attribute(s) or aspect(s) as described above and/or shown in FIG. 1 may be used in the FIG. 2 embodiments.

Figure 3:
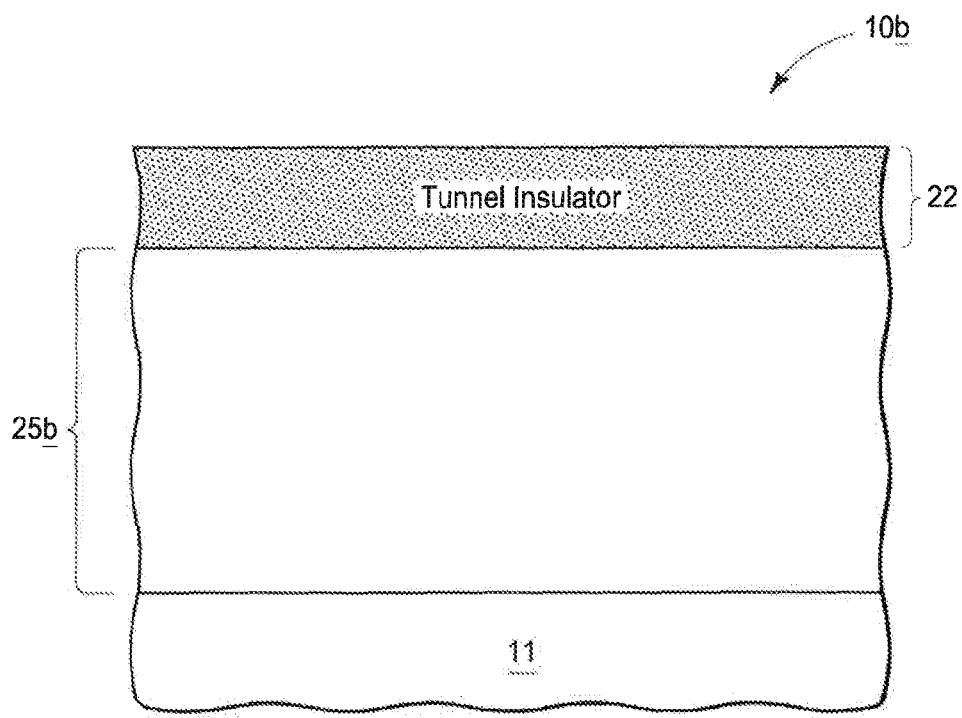
FIG. 3 is a diagrammatic sectional view of substrate fragment in process in the fabrication of a magnetic tunnel junction in accordance with an embodiment of the invention.

Methods of forming a magnetic tunnel junction in accordance with some embodiments of the invention are next described beginning with reference to FIG. 3 with respect to a substrate fragment 10b. Like numerals from the above-described embodiments have been used where appropriate, with some construction differences being indicated with the suffix "b" or with different numerals. Inner magnetic electrode material 25b is formed over substrate 11. Electrode 25b may comprise any one or more of materials 12, 14, 16, 18/18a, and 20 (not shown) as in the above-described embodiments, and/or additional or other material(s), and may be formed using any of the above-described or other process(es). Non-magnetic tunnel insulator material 22 comprising MgO (and that is devoid of B) is formed over inner magnetic electrode material 25b.

After forming tunnel insulator material 22, it is annealed at a temperature of at least about 250° C., and in one embodiment at about 300° C. to about 550° C. Such may be conducted to induce crystallization of MgO of tunnel insulator material 22 and/or to produce desired uniform crystallization therein, such as bcc 001 lattice orientation.

Figure 4:
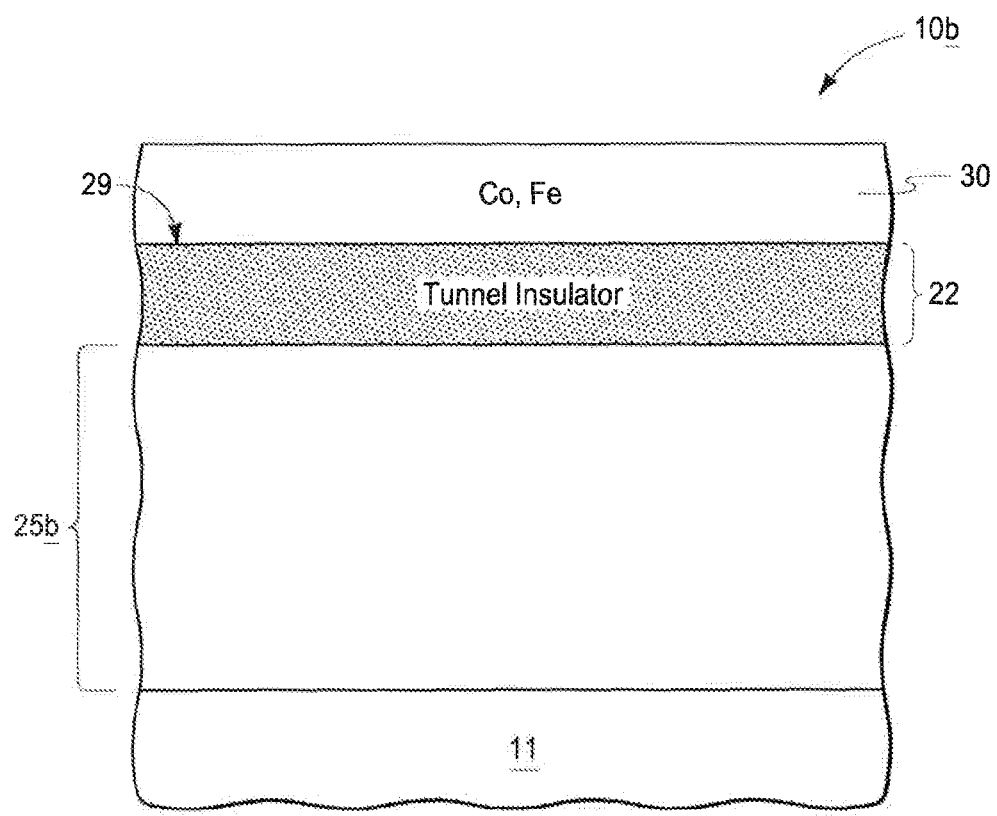
FIG. 4 is a view of the FIG. 3 substrate fragment at a processing step subsequent to that shown by FIG. 3.

Referring to FIG. 4, after the annealing and in one embodiment, outer crystalline magnetic electrode material 30 is formed at a temperature of at least about 150° C. (and in one embodiment at less than about 250° C.) from an MgO-comprising surface of annealed tunnel insulator material 22 (e.g., from a surface 29). Outer crystalline magnetic electrode material 30 comprises Co and Fe and is devoid of B. Any of the above-described Co and Fe-comprising materials (that are devoid of B) may be used.

In one alternate embodiment after the annealing of tunnel insulator material 22, an outer amorphous magnetic electrode material 30 is formed at a temperature of about −250° C. to less than about 0° C. directly against annealed tunnel insulator material 22. Such outer amorphous magnetic electrode material 30 comprises Co and Fe and is devoid of B. It is subsequently annealed at a temperature of at least about 250° C. to form outer crystalline Co and Fe-comprising magnetic electrode material 30 (and that is devoid of B) from an MgO-comprising surface of annealed tunnel insulator material 22 (e.g., surface 29). In one embodiment, the Co and Fe of outer amorphous magnetic electrode material 30 are formed directly against annealed tunnel insulator material 22 at a temperature less than or equal to about −20° C. In one embodiment, the annealing to form outer crystalline magnetic electrode material 30 is conducted at a temperature of at least about 300° C., and in one embodiment at a temperature of no greater than about 400° C.

Figure 5:
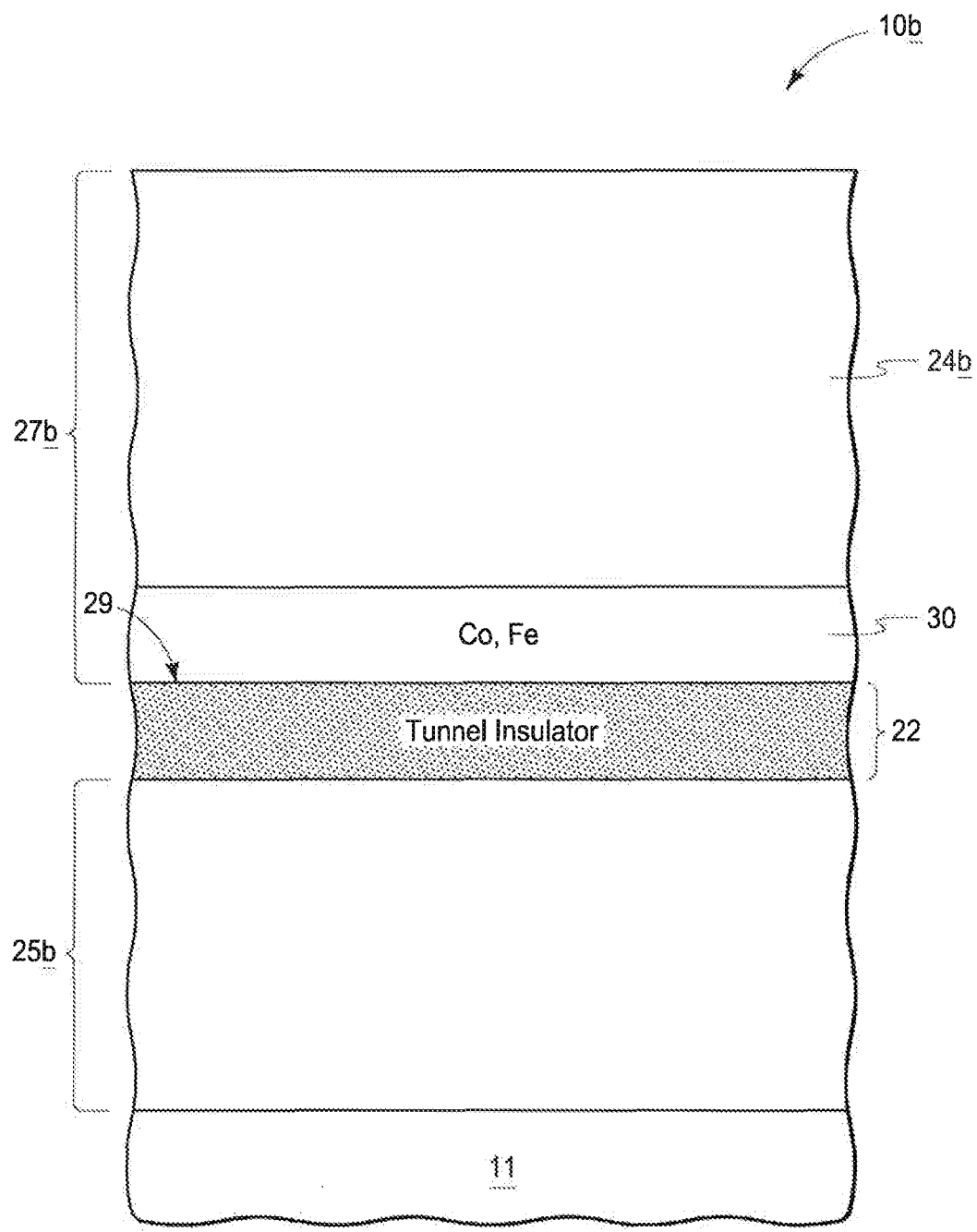
FIG. 5 is a view of the FIG. 4 substrate fragment at a processing step subsequent to that shown by FIG. 4.

Referring to FIG. 5, additional material 24b is deposited over outer crystalline magnetic electrode material 30 to comprise part of conductive magnetic electrode 27b. In one embodiment, outer crystalline magnetic electrode material 30 has a maximum thickness of about 5 Angstroms to about 15 Angstroms. Any other attribute(s) or aspect(s) as described above and/or shown in FIGS. 1 and 2 may be used in the FIGS. 3-5 embodiments.

Embodiments of the invention encompass a magnetic electrode of a magnetic tunnel junction manufactured in accordance with any of the above descriptions. Embodiments of the invention also encompass a magnetic tunnel junction manufactured in accordance with any of the above descriptions.

Further, embodiments of the invention encompass magnetic tunnel junctions independent of the method of manufacture, and the discussion so proceeds and concludes. Such embodiments comprise a conductive first magnetic electrode comprising magnetic recording material and a conductive second magnetic electrode comprising magnetic reference material spaced from the first electrode. Example electrodes 25, 25a, 25b, 27, and 27b as described above may comprise such first or second such electrodes. Alternately or additionally considered, when the magnetic tunnel junction is fabricated as a stack of materials, either the elevationally outer or elevationally inner electrode may comprise magnetic recording material or magnetic reference material. Regardless, a non-magnetic tunnel insulator material comprising MgO (e.g., tunnel insulator material 22) is between the first and second electrodes. The tunnel insulator is devoid of B. In one embodiment, the non-magnetic tunnel insulator material has a maximum thickness of no greater than about 20 Angstroms.

In one embodiment, at least one of the magnetic recording material and the magnetic reference material comprises a crystalline magnetic region that comprises Co and Fe and that is devoid of B, with such region having a maximum thickness of no greater than about 30 Angstroms, in one embodiment that is no greater than about 20 Angstroms, and in one embodiment that is no greater than about 15 Angstroms. Co and Fe of such crystalline magnetic region are directly against MgO of the tunnel insulator. As examples, component 20 and/or 30 (if devoid of B) may comprise such a crystalline magnetic region of magnetic recording material or magnetic reference material that is part of one of electrode 25/25a/25b or electrode 27/27b. In one embodiment, both the magnetic recording material and the magnetic reference material have a crystalline magnetic region that comprises Co and Fe that is devoid of B and that is directly against MgO of the tunnel insulator material and having a maximum thickness of no greater than about 30 Angstroms. Any other attribute(s) or aspect(s) as described above and/or shown in the Figures may be used.

In one embodiment, the non-magnetic tunnel insulator material comprising MgO has a maximum thickness of no greater than about 20 Angstroms. The magnetic recording material and the magnetic reference material of the first and second electrodes each comprise a respective crystalline magnetic region comprising Co and Fe that is devoid of B and has a maximum thickness of no greater than about 30 Angstroms regardless of whether Co and Fe of such crystalline magnetic region is directly against MgO of the tunnel insulator material. In one embodiment, the Co and Fe-comprising crystalline magnetic regions that are devoid of B have a respective maximum thickness of no greater than about 20 Angstroms, and in one embodiment no greater than about 15 Angstroms. In one embodiment, the Co and Fe-comprising crystalline magnetic region that is devoid of B of the second electrode has a maximum thickness that is greater than that of the first electrode. Any other attribute(s) or aspect(s) as described above and/or shown in the Figures may be used.

In one embodiment, the magnetic recording material or the magnetic reference material of at least one of the first and second electrodes comprises a crystalline magnetic region that comprises Co and Fe and that is devoid of B (e.g., material 20). In one such embodiment, such region has a maximum thickness that is no greater than about 20 Angstroms. Such at least one of the first and second electrodes also comprises a non-magnetic MgO-comprising region (e.g., material 16) and an amorphous metal region (e.g., material 18). The Co and Fe-comprising magnetic region that is devoid of B (e.g., material 20) is between the tunnel insulator material (e.g., material 22) and the MgO-comprising region (e.g., material 16). The amorphous metal region (e.g., material 18) is between the MgO-comprising region (e.g., material 16) and the Co and Fe-comprising magnetic region that is devoid of B (e.g., material 20). In one such embodiment, the MgO-comprising region has a maximum thickness of about 3 Angstroms to about 10 Angstroms. In one embodiment, the amorphous metal region has a maximum thickness of about 3 Angstroms to about 5 Angstroms. In one embodiment, the Co and Fe of the crystalline magnetic region are directly against MgO of the tunnel insulator material, and in one embodiment are directly against the amorphous metal region. In one embodiment, the amorphous metal region is directly against MgO of the MgO-comprising region. In one embodiment, the at least one of the first and second electrodes comprises another region comprising Co, Fe, and B (e.g., material 14). In one embodiment, the another region has a maximum thickness less than about 10 Angstroms. In one embodiment, the Co, Fe, and B of the another region are directly against MgO of the MgO-comprising region. Any other attribute(s) or aspect(s) as described above and/or shown in the Figures may be used.

In one embodiment, the magnetic recording material or the magnetic reference material of at least one of the first and second electrodes comprises a crystalline magnetic region that comprises Co and Fe and that is devoid of B (e.g., material 20 or material 30 when devoid of B). Such at least one of the first and second electrodes comprises conductive material (e.g., material 12) and an amorphous metal region (e.g., material 18/18a) different from the conductive material. The Co and Fe-comprising crystalline magnetic region that is devoid of B (e.g., material 20) is between the tunnel insulator material (e.g., material 22) and the conductive material (e.g., material 12). The amorphous metal region (e.g., material 18/18a) is between the conductive material (e.g., material 12) and the Co and Fe-comprising crystalline magnetic region that is devoid of B (e.g., material 20). In one embodiment, the Co and Fe of the crystalline magnetic region are directly against the amorphous metal region, and in one embodiment are directly against MgO of the tunnel insulator material. In one embodiment, the amorphous metal region is directly against the conductive material, and in one embodiment has a maximum thickness of about 10 Angstroms to about 100 Angstroms. In one embodiment, the crystalline magnetic region has a maximum thickness of about 7 Angstroms to about 15 Angstroms. Any other attribute(s) or aspect(s) as described above and/or shown in the Figures may be used.

In one embodiment, the magnetic recording material and the magnetic reference material of the first and second electrodes comprise a respective crystalline magnetic region that is directly against MgO of the tunnel insulator material (e.g., material 20 and material 30). The crystalline magnetic region of at least one of the first and second electrodes comprises Co and Fe and is devoid of B. Such at least one of the first and second electrodes that comprises the Co and Fe-comprising crystalline magnetic region that is devoid of B comprises conductive material (e.g., material 12) and an amorphous metal region (e.g., material 18/18a) different from the conductive material. The Co and Fe-comprising crystalline magnetic region that is devoid of B (e.g., material 20) is between the tunnel insulator material (e.g., material 22) and the conductive material (e.g., material 12), and has a maximum thickness of no greater than about 30 Angstroms. The amorphous metal region (e.g., material 18/18a) is between the conductive material (e.g., material 12) and the Co and Fe-comprising crystalline magnetic region that is devoid of B (e.g., material 20) and has a maximum thickness no greater than about 100 Angstroms. Any other attribute(s) or aspect(s) as described above and/or shown in the Figures may be used.

Each of the above-described magnetic tunnel junction structure embodiments that are independent of method of manufacture may incorporate any of the structural features or attributes shown and/or described above with respect to the method embodiments, and of course can be manufactured using any aspect(s) or attribute(s) of such method embodiments.

The example embodiments of FIGS. 1-4 depict single magnetic tunnel junctions (SMTJs). However, dual magnetic tunnel junctions (DMTJs) or more than dual (two) magnetic tunnel junctions are contemplated

CONCLUSION

In some embodiments, a method of forming a magnetic electrode of a magnetic tunnel junction comprises forming non-magnetic MgO-comprising material over conductive material of the magnetic electrode being formed. An amorphous metal is formed over the MgO-comprising material. Amorphous magnetic electrode material comprising Co and Fe is formed over the amorphous metal. The amorphous magnetic electrode material is devoid of B. Non-magnetic tunnel insulator material comprising MgO is formed directly against the amorphous magnetic electrode material. The tunnel insulator material is devoid of B. After forming the tunnel insulator material, the amorphous Co and Fe-comprising magnetic electrode material is annealed at a temperature of at least about 250° C. to form crystalline Co and Fe-comprising magnetic electrode material from an MgO-comprising surface of the tunnel insulator material. The crystalline Co and Fe-comprising magnetic electrode material is devoid of B.

In some embodiments, a method of forming a magnetic electrode of a magnetic tunnel junction comprises forming amorphous metal over a substrate. Amorphous magnetic electrode material comprising Co and Fe is formed over the amorphous metal at a temperature of about −250° C. to about 30° C. The amorphous magnetic electrode material is devoid of B. Non-magnetic tunnel insulator material comprising MgO is formed directly against the amorphous magnetic electrode material. The tunnel insulator material is devoid of B. After forming the tunnel insulator material, the amorphous Co and Fe-comprising magnetic electrode material is annealed at a temperature of at least about 250° C. to form crystalline Co and Fe-comprising magnetic electrode material from an MgO-comprising surface of the tunnel insulator material. The crystalline Co and Fe-comprising magnetic electrode material is devoid of B.

In some embodiments, a method of forming a magnetic tunnel junction comprises forming inner magnetic electrode material over a substrate. Non-magnetic tunnel insulator material comprising MgO is formed over the inner magnetic electrode material. The tunnel insulator material is devoid of B. After forming the tunnel insulator material, the tunnel insulator material is annealed at a temperature of at least about 250° C. After the annealing, outer crystalline magnetic electrode material is formed at a temperature of at least about 150° C. from an MgO-comprising surface of the annealed tunnel insulator material. The outer crystalline magnetic electrode material comprises Co and Fe and is devoid of B.

In some embodiments, a method of forming a magnetic tunnel junction comprises forming inner magnetic electrode material over a substrate. Non-magnetic tunnel insulator material comprising MgO is formed over the inner magnetic electrode material. The tunnel insulator material is devoid of B. After forming the tunnel insulator material, the tunnel insulator material is annealed at a temperature of at least about 250° C. After the annealing of the tunnel insulator material, outer amorphous magnetic electrode material is formed at a temperature of about −250° C. to less than 0° C. directly against the annealed tunnel insulator material. The outer amorphous magnetic electrode material comprises Co and Fe that is directly against the annealed tunnel insulator material and which is devoid of B. The outer amorphous Co and Fe-comprising magnetic electrode material is annealed at a temperature of at least about 250° C. to form outer crystalline Co and Fe-comprising magnetic electrode material from an MgO-comprising surface of the annealed tunnel insulator material. The crystalline Co and Fe-comprising outer magnetic electrode material is devoid of B.

In some embodiments, a magnetic tunnel junction comprises a conductive first magnetic electrode comprising magnetic recording material. A conductive second magnetic electrode is spaced from the first electrode and comprises magnetic reference material. A non-magnetic tunnel insulator material comprising MgO is between the first and second electrodes. The tunnel insulator material is devoid of B and has a maximum thickness that is no greater than about 20 Angstroms. At least one of the magnetic recording material and the magnetic reference material comprises a crystalline magnetic region that comprises Co and Fe and that is devoid of B. The Co and Fe-comprising crystalline magnetic region that is devoid of B has a maximum thickness of no greater than about 30 Angstroms. Co and Fe of the crystalline magnetic region are directly against MgO of the tunnel insulator material.

In some embodiments, a magnetic tunnel junction comprises a conductive first magnetic electrode comprising magnetic recording material. A conductive second magnetic electrode is spaced from the first electrode and comprises magnetic reference material. A non-magnetic tunnel insulator material comprising MgO is between the first and second electrodes. The tunnel insulator is devoid of B and has a maximum thickness that is no greater than about 20 Angstroms. The magnetic recording material and the magnetic reference material of the first and second electrodes each comprises a respective crystalline magnetic region comprising Co and Fe that is devoid of B, and having a maximum thickness of no greater than about 30 Angstroms.

In some embodiments, a magnetic tunnel junction comprises a conductive first magnetic electrode comprising magnetic recording material. A conductive second magnetic electrode is spaced from the first electrode and comprises magnetic reference material. A non-magnetic tunnel insulator material comprising MgO is between the first and second electrodes. The tunnel insulator material is devoid of B. The magnetic recording material or the magnetic reference material of at least one of the first and second electrodes comprises a crystalline magnetic region that comprises Co and Fe and that is devoid of B. The at least one of the first and second electrodes comprises a non-magnetic MgO-comprising region and an amorphous metal region. The Co and Fe-comprising crystalline magnetic region that is devoid of B is between the tunnel insulator material and the MgO-comprising region. The amorphous metal region is between the MgO-comprising region and the Co and Fe-comprising crystalline magnetic region that is devoid of B.

In some embodiments, a magnetic tunnel junction comprises a conductive first magnetic electrode comprising magnetic recording material. A conductive second magnetic electrode is spaced from the first electrode and comprises magnetic reference material. A non-magnetic tunnel insulator material comprising MgO is between the first and second electrodes. The tunnel insulator material is devoid of B. The magnetic recording material or the magnetic reference material of at least one of the first and second electrodes comprises a crystalline magnetic region that comprises Co and Fe and that is devoid of B. The at least one of the first and second electrodes comprises conductive material and an amorphous metal region different from the conductive material. The Co and Fe-comprising crystalline magnetic region that is devoid of B is between the tunnel insulator material and the conductive material. The amorphous metal region is between the conductive material and the Co and Fe-comprising region that is devoid of B.

In some embodiments, a magnetic tunnel junction comprises a conductive first magnetic electrode comprising magnetic recording material. A conductive second magnetic electrode is spaced from the first electrode and comprises magnetic reference material. A non-magnetic tunnel insulator material comprising MgO is between the first and second electrodes. The tunnel insulator material is devoid of B. The magnetic recording material and the magnetic reference material of the first and second electrodes comprise a respective crystalline magnetic region that is directly against MgO of the tunnel insulator material. The crystalline magnetic region of at least one of the first and second electrodes comprises Co and Fe and is devoid of B. The at least one of the first and second electrodes that comprises the Co and Fe-comprising crystalline magnetic region that is devoid of B comprises conductive material and an amorphous metal region different from the conductive material. The Co and Fe-comprising crystalline magnetic region that is devoid of B is between the tunnel insulator material and the conductive material and has a maximum thickness no greater than about 30 Angstroms. The amorphous metal region is between the conductive material and the Co and Fe-comprising crystalline magnetic region that is devoid of B and has a maximum thickness no greater than about 100 Angstroms.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a magnetic electrode of a magnetic tunnel junction, comprising:
   forming non-magnetic MgO-comprising material over conductive material of the magnetic electrode being formed;
   forming amorphous metal over the MgO-comprising material, the amorphous metal comprising an alloy of a) at least one of Mo and Cr, and at least one of Fe, Co, and Ni, or b) Al and Ni;
   forming amorphous magnetic electrode material comprising Co and Fe over the amorphous metal, the amorphous magnetic electrode material being devoid of B;
   forming non-magnetic tunnel insulator material comprising MgO directly against the amorphous magnetic electrode material, the tunnel insulator material being devoid of B; and
   after forming the tunnel insulator material, annealing the amorphous Co and Fe-comprising magnetic electrode material at a temperature of at least 250° C. to form crystalline Co and Fe-comprising magnetic electrode material from an MgO-comprising surface of the tunnel insulator material, the crystalline Co and Fe-comprising magnetic electrode material being devoid of B.

2. The method of claim 1 comprising forming a material comprising Co, Fe, and B over the conductive material; and forming the MgO-comprising material over the material comprising Co, Fe, and B.

3. The method of claim 1 wherein the Co and Fe of the amorphous magnetic electrode material are formed directly against the amorphous metal.

4. The method of claim 1 wherein the amorphous magnetic electrode material is formed at a temperature of 0° C. to 30° C.

5. The method of claim 4 wherein the amorphous magnetic electrode material is formed at a temperature of at least 20° C.

6. The method of claim 1 wherein the amorphous magnetic electrode material is formed at a temperature of −250° C. to less than 0° C.

7. The method of claim 6 wherein the amorphous magnetic electrode material is formed at a temperature of −250° C. to −20° C.

8. The method of claim 1 wherein the amorphous metal has a maximum thickness of 3 Angstroms to 5 Angstroms.

9. The method of claim 1 wherein the crystalline Co and Fe-comprising magnetic electrode material has a maximum thickness of 7 Angstroms to 15 Angstroms.

10. A magnetic tunnel junction incorporating the magnetic electrode produced using the method of claim 1.

11. A method of forming a magnetic electrode of a magnetic tunnel junction, comprising:
   forming amorphous metal over a substrate, the amorphous metal comprising an alloy of a) at least one of Mo and Cr, and at least one of Fe, Co, and Ni, or b) Al and Ni;
   forming amorphous magnetic electrode material comprising Co and Fe over the amorphous metal at a temperature of −250° C. to 30° C., the amorphous magnetic electrode material being devoid of B;
   forming non-magnetic tunnel insulator material comprising MgO directly against the amorphous magnetic electrode material, the tunnel insulator material being devoid of B; and
   after forming the tunnel insulator material, annealing the amorphous Co and Fe-comprising magnetic electrode material at a temperature of at least 250° C. to form crystalline Co and Fe-comprising magnetic electrode material from an MgO-comprising surface of the tunnel insulator material, the crystalline Co and Fe-comprising magnetic electrode material being devoid of B.

12. The method of claim 11 wherein the Co and Fe of the amorphous magnetic electrode material are formed directly against the amorphous metal.

13. The method of claim 11 wherein the amorphous metal is formed directly against other physically and/or chemically different conductive material of the magnetic electrode being formed.

14. The method of claim 11 wherein,
the Co and Fe of the amorphous magnetic electrode material are formed directly against the amorphous metal; and
the amorphous metal is formed directly against other physically and/or chemically different conductive material of the magnetic electrode being formed.

15. The method of claim 11 wherein the amorphous metal has a maximum thickness of 10 Angstroms to 100 Angstroms.

16. The method of claim 11 wherein the amorphous magnetic electrode material is formed at a temperature of 0° C. to 30° C.

17. The method of claim 11 wherein the amorphous magnetic electrode material is formed at a temperature of −250° C. to less than 0° C.

18. The method of claim 11 wherein the amorphous metal comprises an alloy of transition metals.

19. The method of claim 18 wherein the amorphous metal consists essentially of an alloy of transition metals.

20. A magnetic tunnel junction incorporating the magnetic electrode produced using the method of claim 11.

21. The method of claim 1 wherein the amorphous metal comprises an alloy of Al and Ni.

22. The method of claim 1 wherein the amorphous metal comprises an alloy of Mo and at least one of Fe, Co, and Ni.

23. The method of claim 1 wherein the amorphous metal comprises an alloy of Cr and at least one of Fe, Co, and Ni.

24. The method of claim 1 wherein the amorphous metal comprises an alloy comprising at least one of Mo and Cr, and Fe.

25. The method of claim 1 wherein the amorphous metal comprises an alloy comprising at least one of Mo and Cr, and Co.

26. The method of claim 1 wherein the amorphous metal comprises an alloy comprising at least one of Mo and Cr, and Ni.

27. The method of claim 1 wherein the amorphous metal comprises an alloy comprising Mo and Cr.

28. The method of claim 11 wherein the amorphous metal comprises an alloy of Al and Ni.

29. The method of claim 11 wherein the amorphous metal comprises an alloy of Mo and at least one of Fe, Co, and Ni.

30. The method of claim 11 wherein the amorphous metal comprises an alloy of Cr and at least one of Fe, Co, and Ni.

31. The method of claim 11 wherein the amorphous metal comprises an alloy comprising at least one of Mo and Cr, and Fe.

32. The method of claim 11 wherein the amorphous metal comprises an alloy comprising at least one of Mo and Cr, and Co.

33. The method of claim 11 wherein the amorphous metal comprises an alloy comprising at least one of Mo and Cr, and Ni.

34. The method of claim 11 wherein the amorphous metal comprises an alloy comprising Mo and Cr.

* * * * *